United States Patent [19]
Collins et al.

[11] Patent Number: 5,926,366
[45] Date of Patent: *Jul. 20, 1999

[54] TAB AND SLOT DISK DRIVE VIBRATION REDUCTION STRUCTURE

[75] Inventors: Pat Eliot Collins; Theodore Ernst Bruning, III, both of Colorado Springs; Grant Edward Carlson, Woodland Park; Karl Heinz Cunha, Colorado Springs, all of Colo.

[73] Assignee: Digital Equipment Corporation, Houston, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/749,465

[22] Filed: Nov. 15, 1996

[51] Int. Cl.$^6$ .............................. G06F 1/16; G11B 33/08; H05K 7/10; H05K 7/12
[52] U.S. Cl. .......................... 361/685; 361/726; 361/747
[58] Field of Search .......................... 364/708.1; 361/683, 361/685, 725–727, 732, 740, 747; 312/223.2

[56] References Cited

U.S. PATENT DOCUMENTS

| | | |
|---|---|---|
| 1,918,149 | 7/1933 | Sullivan . |
| 2,043,987 | 6/1936 | Brown . |
| 3,547,274 | 12/1970 | Sosinkski . |
| 3,559,813 | 2/1971 | Sosinkski . |
| 4,012,089 | 3/1977 | Ward . |
| 4,027,058 | 5/1977 | Wootten . |
| 4,479,263 | 10/1984 | Rosenfeldt et al. . |
| 4,663,240 | 5/1987 | Hadju et al. . |
| 4,831,476 | 5/1989 | Branc et al. . |
| 4,845,591 | 7/1989 | Pavie . |
| 4,879,434 | 11/1989 | Assel et al. . |
| 5,021,905 | 6/1991 | Sleger . |
| 5,081,551 | 1/1992 | Aruga . |
| 5,214,549 | 5/1993 | Baker et al. . |
| 5,235,482 | 8/1993 | Schmitz . |
| 5,247,427 | 9/1993 | Driscoll et al. . |
| 5,329,492 | 7/1994 | Porter ........................................ 361/683 |
| 5,333,098 | 7/1994 | Deluca et al. . |
| 5,422,767 | 6/1995 | Hatchett et al. . |
| 5,431,974 | 7/1995 | Pierce . |
| 5,469,311 | 11/1995 | Nishida et al. . |
| 5,471,099 | 11/1995 | Larabell et al. . |
| 5,483,423 | 1/1996 | Lewis et al. . |
| 5,515,239 | 5/1996 | Kamerman et al. ................. 361/685 X |
| 5,576,513 | 11/1996 | Günther et al. . |

FOREIGN PATENT DOCUMENTS

| | | |
|---|---|---|
| 632 455 A | 1/1995 | European Pat. Off. . |
| 763 792 A | 3/1997 | European Pat. Off. . |

OTHER PUBLICATIONS

"Adjustment and Alignment Interconnect Technique for DASDS," IBM Technical Disclosure Bulletin, vol. 32, No. 7, Dec. 1, 1989.

"Interference Fit Positive DASD Grounding Strap," IBM Technical Disclosure Bulletin, vol. 34, No. 4A, Sep. 1, 1991.

*Primary Examiner*—Lynn D. Feild
*Attorney, Agent, or Firm*—William J. Kubida; Holland & Hart LLP

[57] ABSTRACT

A connection structure between a disk drive housing and a rack to eliminate a source of vibration, and hence improve the performance of the disk drive. An interference-fit tab and slot vibration reduction structure is described, where the tab is formed on the housing and the slot is formed on the shelf. The tab and slot vibration reduction structure includes a disk drive having an outer housing, the housing having a bottom surface. A tab extends from the bottom of the housing. A shelf is provided on the rack system for receiving one or a plurality of disk drive housings, and one slot is formed in a front edge of the shelf for each drive housing. When the disk drive housing is positioned on the shelf with the tab positioned in the slot to create an interference fit, the housing is rigidly attached to the shelf.

5 Claims, 6 Drawing Sheets

TAB AND SLOT DISK DRIVE VIBRATION REDUCTION STRUCTURE

This application is related to the following commonly owned applications: Ser. No. 08/751,126, filed Nov. 15, 1996, entitled "Attenuating Vibrations in a Mounting Shelf for Multiple Disk Drives"; Ser. No. 08/751,127, filed Nov. 15, 1996, entitled "High Frequency EMI Shield with Air Flow for Electronic Device Enclosure"; and Ser. No. 08/749,466, filed Nov. 15, 1996, entitled Anti-Slamming Latch Apparatus for Modular Component Installations, all filed on this same date.

FIELD OF ART

The present invention relates to disk drive storage mechanisms, and more particularly relates to a new and improved structure for attaching a disk drive housing to a rack which reduces vibration of the disk drive.

BACKGROUND

The minimization of vibration in disk drives assemblies is the source of much continuing effort in the disk drive industry. The basic problem is how to rigidly mount a disk drive assembly in an enclosure, such as a rack system, to help minimize vibration problems, while simultaneously allowing safe, easy removal and replacement of the disk drive assembly. In the past, the disk drives were bolted to the enclosures and were isolated from the enclosures with bushings or grommets. This vibration damping structure worked for disk drives that were less susceptible to vibration problems than the disk drives of the present, but seriously impeded the ability to easily remove and replace the disk drive assemblies.

Presently, disk drives are becoming smaller, faster and lighter, with higher track densities. Due to these changes, it is much easier to disturb the disk drives, which causes several types of disk errors. In addition, in the effort to create the smaller disk drives, vibration mitigation in the disk drive housing has not been emphasized. Thus, as the areal density becomes greater, the detrimental effect of vibration increases. Further, efforts at designing damping systems in the drive housing has been deemphasized because it was found that each damping system had to be tuned to the particular drive system.

Vibration causes many problems, including but not limited to increasing retry rates, which devastates system performance. In addition, as drive RPMs become higher, the vibration problems are accordingly increased. Also, the increase in track densities have forced an even greater burden of vibration attenuation to the systems integration level.

In order to minimize the detrimental effects of vibration on drive performance, several features can be designed into the rack system to attempt to eliminate or dampen vibration sources and transmission. Vibration arresting measures can be implemented where the rack system is mounted to the floor, where each rack is attached to the rack system, where the drive housing is attached to the shelf, and inside the drive housing itself. As described above, vibration can cause serious performance problems, and even permanent damage, to an individual drive or a group of drives. The most efficient manner of protecting the customers investment with respect to vibration attenuation directs vibration reduction efforts to the interaction of the disk drive and the shelf upon which it is positioned.

In order to minimize the transmissibility of the vibration path to the disk drive and thus to the heads, one must either dampen the structure to lower the transmissibility, or attempt to avoid the cause of vibrations all together. Offending vibrations can come from adjacent drives, adjacent shelves, fans, floor movement, outside traffic, HVAC systems, etc.

It is to overcome the shortcomings in the prior art that the present invention was developed.

SUMMARY OF THE INVENTION

The present invention in general terms concerns a connection structure between a disk drive housing and a rack to eliminate a source of vibration, and hence improve the performance of the disk drive. This invention is directed to attaching the drive housing or carrier to the rack in a rigid manner which reduces the development of vibrations due to the rattling of the housing in the rack. More particularly, this invention concerns an interference-fit tab and slot vibration reduction structure, where the tab is formed on the housing and the slot is formed on the shelf.

Generally, the tab and slot vibration reduction structure includes a disk drive having an outer housing, the housing having a bottom surface. A tab extends from the bottom of the housing. A shelf is provided on the rack system for receiving one or a plurality of disk drive housings, and one slot is formed in a front edge of the shelf for each drive housing. When the disk drive housing is positioned on the shelf with the tab positioned in the slot, the housing is rigidly attached to the shelf, thereby reducing the development of vibrations by the housing rattling against the shelf.

More specifically, the housing has a front surface, and the tab is spaced away from the bottom surface of the housing and extends rearwardly from the front surface. The slot is formed adjacent to the front edge of the shelf, and includes a recess having a top wall and opposing end walls. The tab engages the top wall of the recess when the disk drive housing is positioned on the shelf with the tab positioned in the slot to firmly attach the housing to the shelf. The top wall is a fixed beam having opposing ends, and is attached to the slot at opposing end walls, and deflects upwardly upon engagement with the tab. A bearing surface is formed on the undersurface of the top wall, and extends or protrudes therefrom to make contact with the tab as it is inserted into the slot.

The interaction of the tab with the top wall of the slot, specifically by the tab upwardly flexing the top wall, causes a downward force to be created on the tab, which clamps or secures the bottom of the housing to the bottom guide panel. The housing is thus rigidly attached to the shelf to inhibit the development of vibrations.

Accordingly, it is a primary object of the present invention to provide a structural connection at the interface of a drive housing and a shelf of a rack system to attach the housing thereto and reduce or minimize the generation of vibrations therefrom.

It is another object of the present invention to provide a tab and slot structure with an interference fit to clamp a drive housing rigidly to a shelf.

Still another object of the present invention is to provide a tab and slot structure with an interference fit that reduces vibration and allows convenient extraction and replacement of drive housings from a shelf.

Other aspects, features and details of the present invention can be more completely understood by reference to the following detailed description of a preferred embodiment, taken in conjunction with the drawings, and from the appended claims.

DETAILED SPECIFICATION

Figure 1:
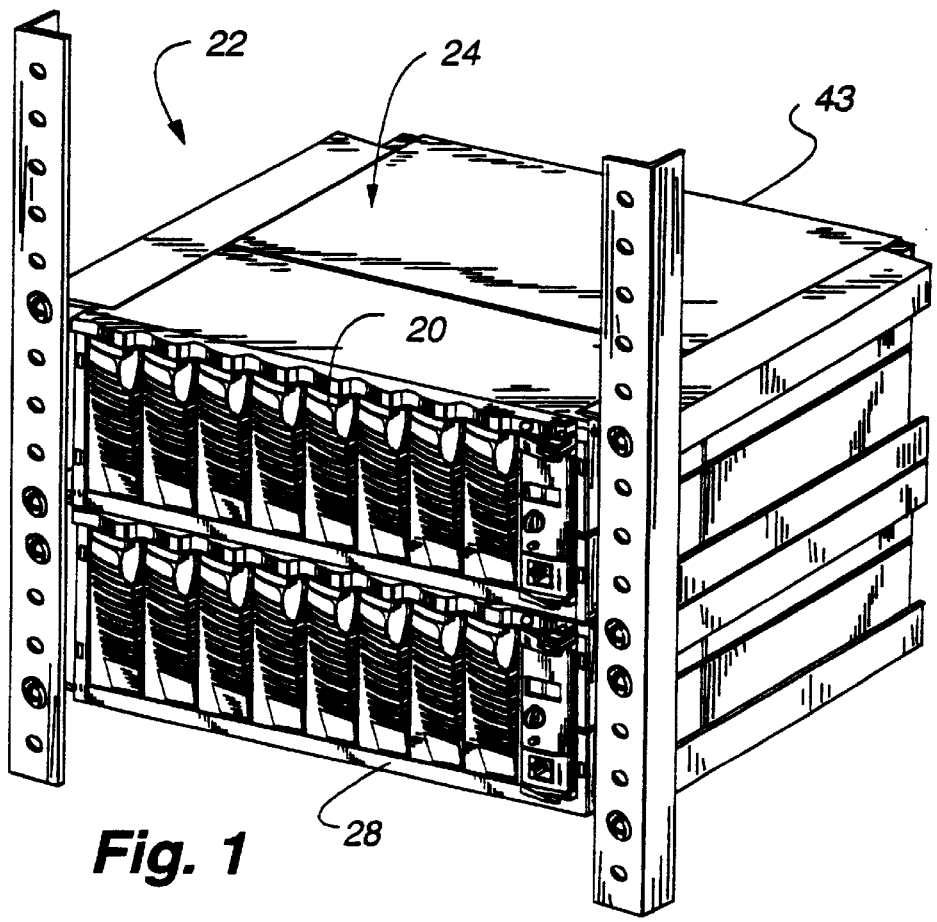
FIG. 1 is a perspective view of a disk drive assembly rack system illustrating a plurality of shelves containing disk drive assembling, incorporating the tab and slot structure of the present invention.
Figure 9:
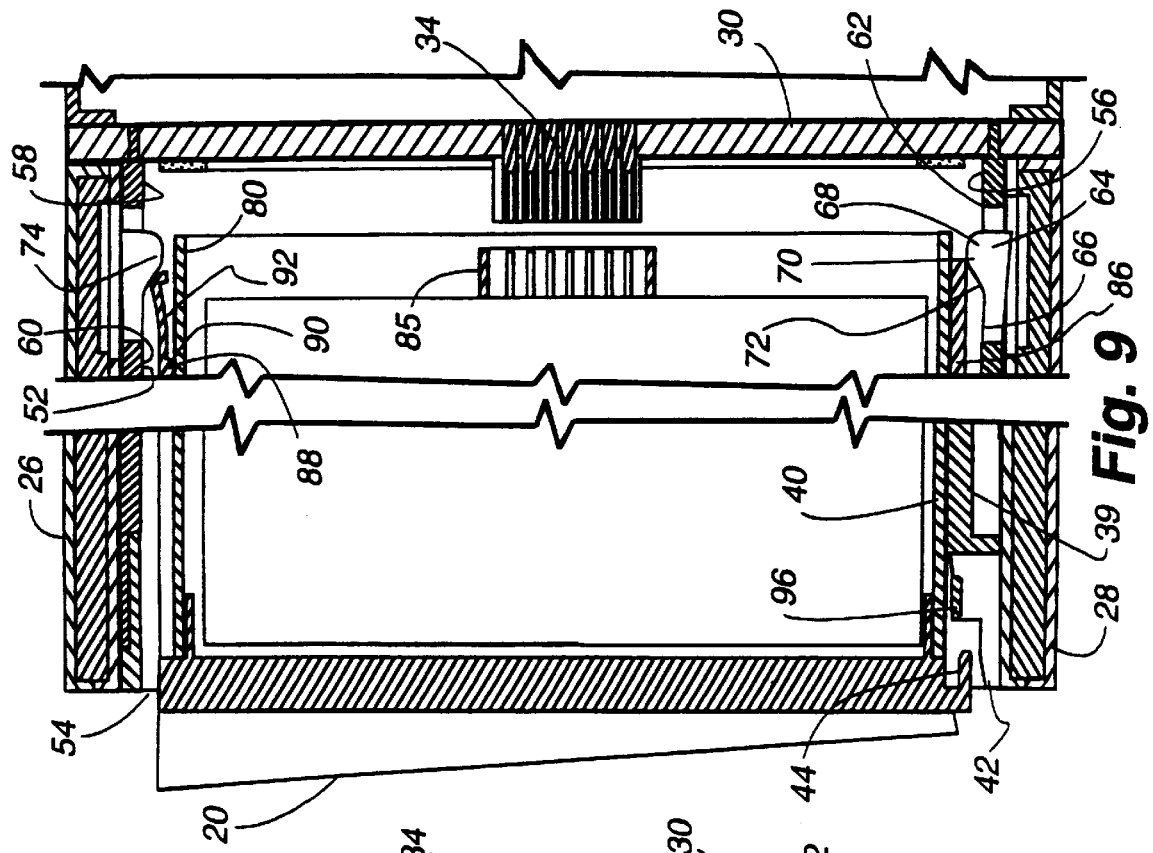
FIG. 9 is an enlarged partial representative section of a disk drive assembly prior to full insertion in a rack system, with the left portion taken through the tab and slot structure, and the right portion taken through the guide structure.
Figure 10:
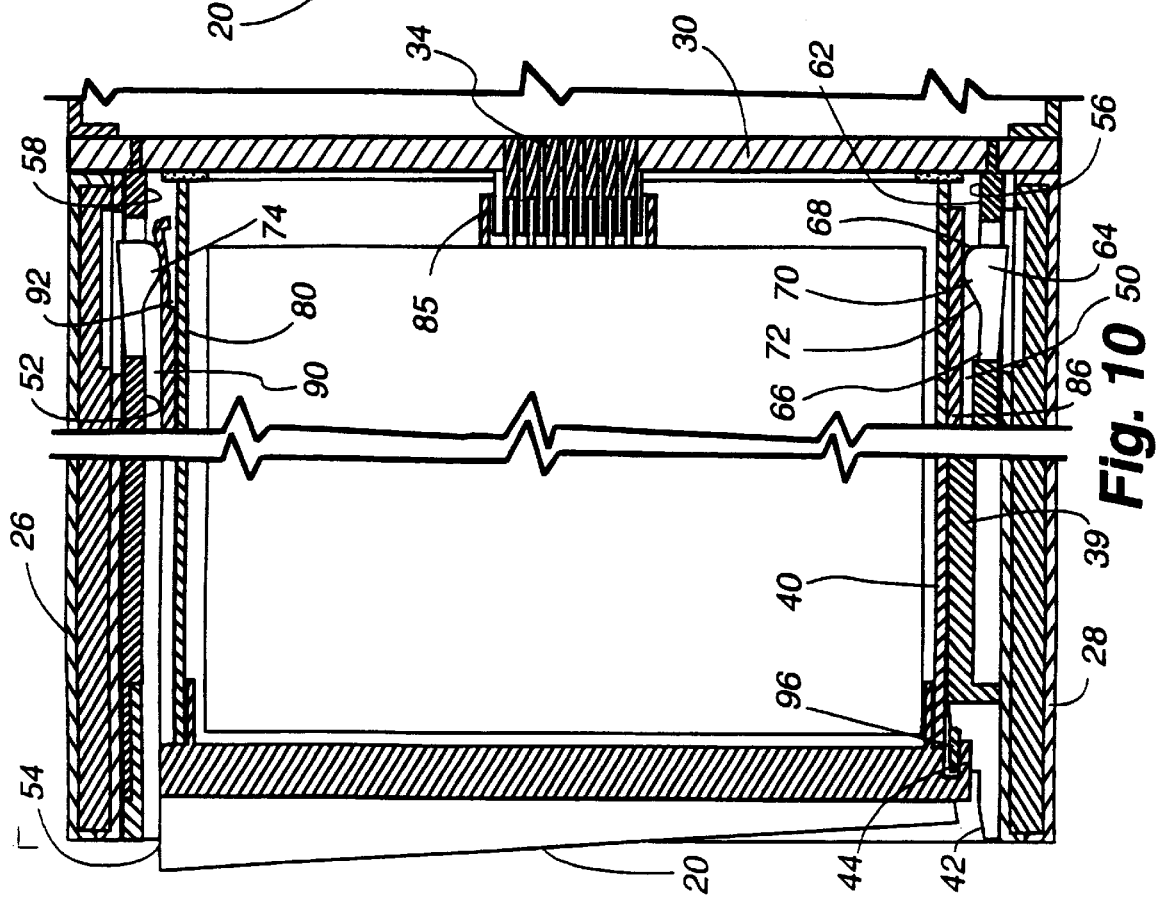
FIG. 10 is an enlarged partial section of a disk drive assembly prior to full insertion, taken along line 10—10 of FIG. 2, with the left portion taken through the tab and slot structure, and the right portion taken through the guide structure.

As shown in FIG. 1, disk drive assemblies 20 are grouped in rack systems 22 to provide high-volume centralized memory storage capability. Typically, the rack systems 22 are analogous to a cabinet, with several levels of shelves 24 spaced vertically from the adjacent racks. Each shelf 24 has a rectangular tube shape, with a top panel 26, a bottom panel 28, and a mid-panel 30. The individual disk drive assemblies 20, enclosed in drive housings 32, are positioned in the shelf 24 and typically engage the mid-panel 30 where the power and communications connectors 34 are located (FIGS. 9 and 10). The rack systems 22 are typically designed to allow easy access to the drive assemblies 20 for maintenance and replacement purposes. Each drive assembly 20 is able to be individually removed and replaced from the rack system 22 as necessary.

Figure 2:
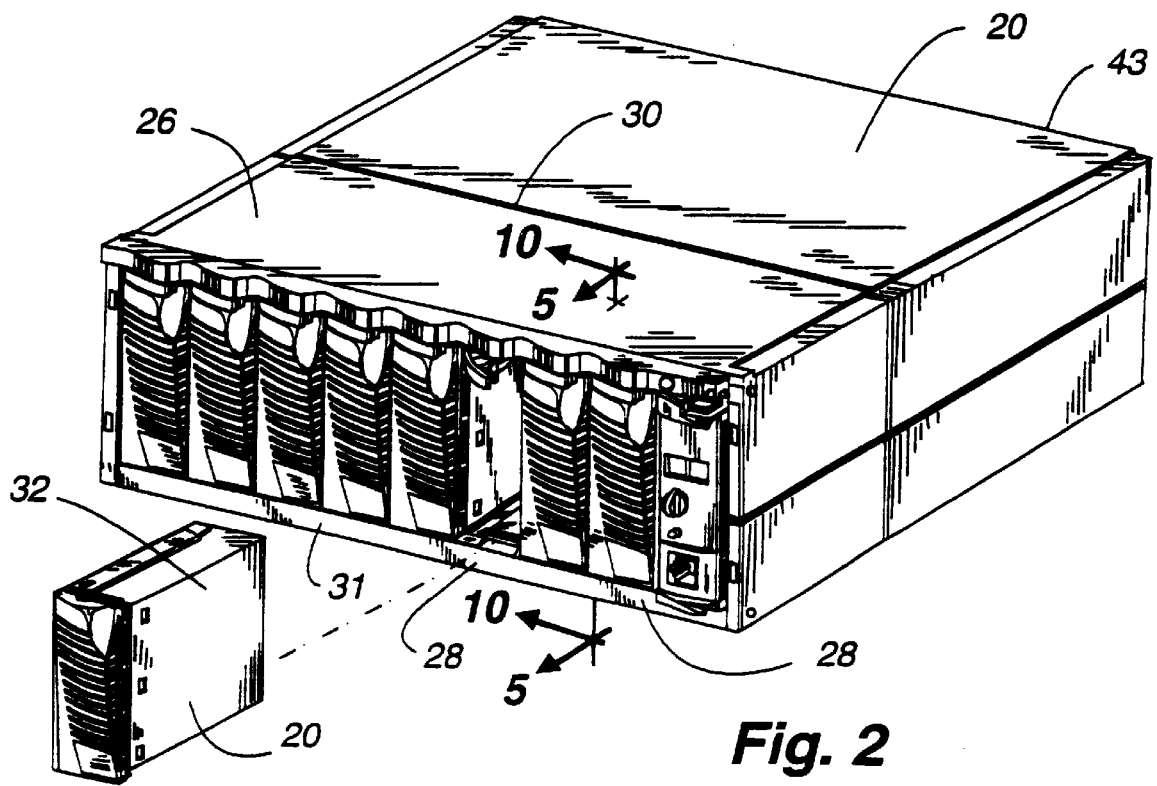
FIG. 2 is a perspective view of a single shelf of a disk drive assembly rack system with one disk drive assembly extracted therefrom.
Figure 3:
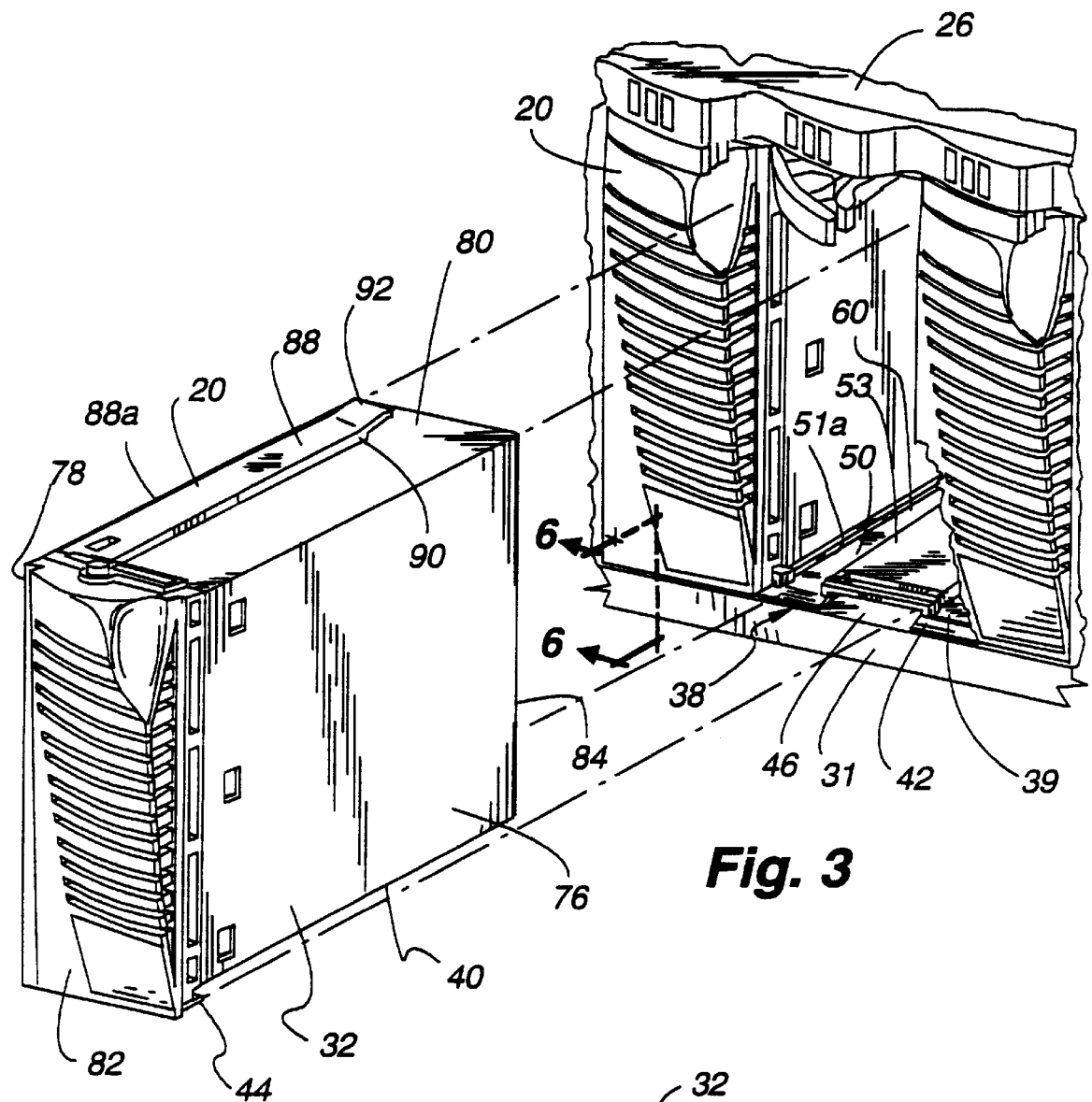
FIG. 3 is an enlarged partial perspective view similar to FIG. 2.

Referring to FIGS. 1, 2 and 3, a rack system 22 incorporating the tab and slot vibration reducing structure 36 (FIG. 6) is shown. The vibration mitigation measures of the present invention are emphasized at the interface between the individual drive housing 32 and the shelf 24. Each drive housing 32 rests upright on the shelf 24 and engages the mid-panel 30 for power and communications support. The housing 32 is precisely positioned on the shelf 24 by a guide structure 38 to insure that the housing 32 is properly aligned with the power and communications connector 34. The tab and slot structure 36 of the present invention is formed at the interface of the bottom 40 of the housing 32 and the front 31 of the bottom panel 28 of the shelf 24. As the housing 32 is positioned on the shelf 24 in the guide structure 38, and seats in engagement with the power and communication connectors 34, a tab 44 formed on the housing 32 inserts into a slot 46 formed on the front edge 31 of the shelf 24 to bias the housing 32 against the shelf 24. The slot 46 receives the tab 44 in a resilient interference fit, as described below, which deflects a portion of the slot 46 upwardly and biases the tab 44 downwardly, which in turn biases the housing 32 against the shelf 24.

The instant invention reduces vibration by securely attaching the housing 32 to the shelf 24 to make the shelf 24 and the housing assembly 32 a continuous, rigid structure. In short, the instant invention securely connects the drive housing 32 to the shelf 24, and helps the housing 32 and shelf 24 act as one rigid structure, which reduces or eliminates the generation of vibrations at the interface between the two, while allowing easy removal and replacement.

More specifically, referring to FIGS. 3, 5, 9 and 10, the shelf is a rectangular tube, as defined above. Each panel of the shelf has an outer 33 and inner 35 layer of sheet metal, with a material 37 sandwiched in between. A lower or bottom guide panel 39 is attached to the bottom panel 28 in front of the mid-panel 30, and an upper guide panel 41 is attached to the top panel 26 in front of the mid-panel 30. The disk drive assemblies 20 are positioned between the upper 41 and lower 39 guide panels as described in detail below. Power supplies and necessary electrical components (not shown) for interfacing with the drive assemblies are positioned in the shelf 24 between the mid-panel 30 and the rear end 43 of the shelf 24.

The lower guide panel 39 defines a plurality of lower guide grooves 50 extending between the front edge 42 of the lower guide panel 39 and the mid-panel 30, and are spaced laterally across the width of the lower guide panel 39. The upper guide panel 41 defines a plurality of upper guide grooves 52 extending between the front edge 54 of the upper guide panel 41 and the mid-panel 30, and are spaced laterally across the width of the upper guide panel 41. Each of the upper grooves 52 corresponds to and are positioned directly above a lower groove 50 (See FIG. 5).

There is one lower groove 50 and one upper groove 52 for each drive housing 32. Each lower groove 50 extends from the front edge 42 of the lower guide panel 39 and terminates just prior to reaching the rear edge 56 of the lower guide panel. Each groove 50 has parallel opposing sidewalls 51a and b (See FIG. 5), is preferably approximately 0.6 inches wide, and has a recessed surface 60 spaced approximately 0.1 inches offset from the surface 53 of the lower guide panel 39.

Each upper groove 52 extends from the front edge 54 of the upper guide panel 41 and terminates just prior to reaching the rear edge 58 of the upper guide panel. Each groove 52 has parallel opposing sidewalls 55a and b (See FIG. 5), is preferably approximately 0.6 inches wide, and has a recessed surface 61 spaced approximately 0.1 inches offset from the surface 57 of the upper guide panel 41.

Referring to FIGS. 9 and 10, a flexible tongue 64 is formed in the recessed surface 60 adjacent the rear end 62 of each groove 50 in the lower guide panel 39. The tongue 64 is a cantilever beam having a main body 66 fixed at one end and free at the other end 68. The free end 68 defines a protrusion 70 having a sloped surface 72 facing upwardly and toward the front edge 42 of the shelf 28. The main body 66 of the flexible tongue 64 is preferably flush with the recessed surface 60, with the protrusion 70 extending upwardly. The top of the protrusion 70 is flat. The grooves 52 in the upper guide panel have corresponding tongue protrusions 74 analogous to those in the lower grooves 50.

Figure 4:
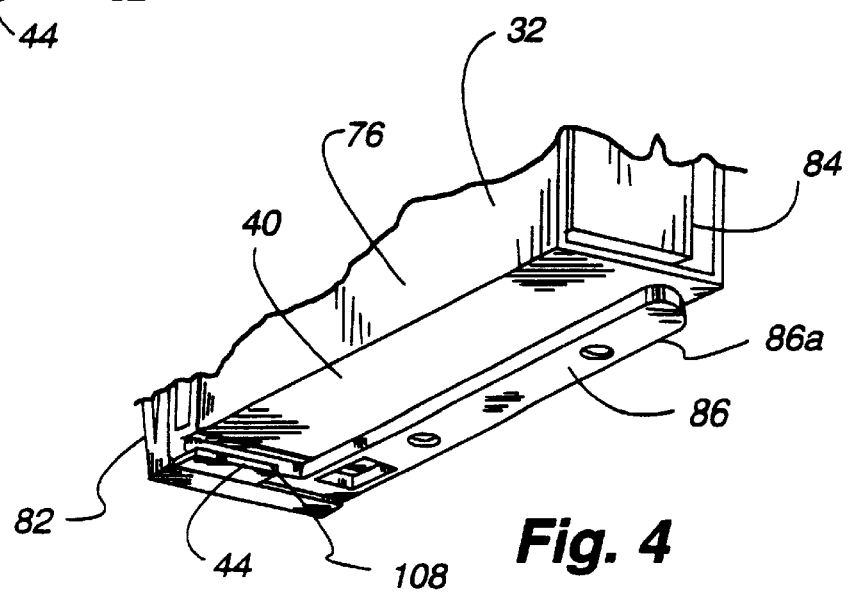
FIG. 4 is an enlarged partial bottom perspective view of a disk drive assembly.

Referring to FIGS. 3 and 4, the housing 32 for the drive 20 has opposing sidewalls 76, 78, opposing top 80 and bottom 40 walls, and opposing front 82 and rear 84 walls.

The rear wall 84 includes the mating connection structure 85 (FIGS. 9 and 10) to connect to the power and communication interface connector 34 on the mid-wall 30 of the shelf 24. The bottom wall 40 defines a continuous elongated bottom guide rail 86 that is formed along one edge of the bottom wall 40, and is approximately 0.580 inches to allow insertion into the lower guide groove 50.

The top surface 80 of the drive housing 32 also defines an elongated and continuous top guide rail 88 (also approximately 0.580 inches) formed along one edge and coextending with the lower guide rail 86. The rear end 90 of the top guide rail 88 includes a spring portion 92. The spring portion 92 is disconnected from the top wall 80 of the housing 32, and slopes upwardly away from the top surface 80. The upper 52 and bottom 50 guide grooves, in combination with the upper 88 and bottom 86 guide rails, form the guide structure 38 used to insure accurate placement of the drive housing 32 in the shelf.

The guide structure 38 acts to guide the drive housing 32 into the proper position on the shelf 24 during insertion and extraction of the drive housing 32. Upon mounting a housing 32 on the shelf 24, the bottom guide rail 86 is inserted into the guide groove 50 and slides therealong from the front of the shelf 24 to the rear of the shelf 24. The bottom guide groove 50 restrains the guide rail 86, and thus the housing 32, from becoming laterally misaligned for connection with the power and communications connector 34.

Figure 5:
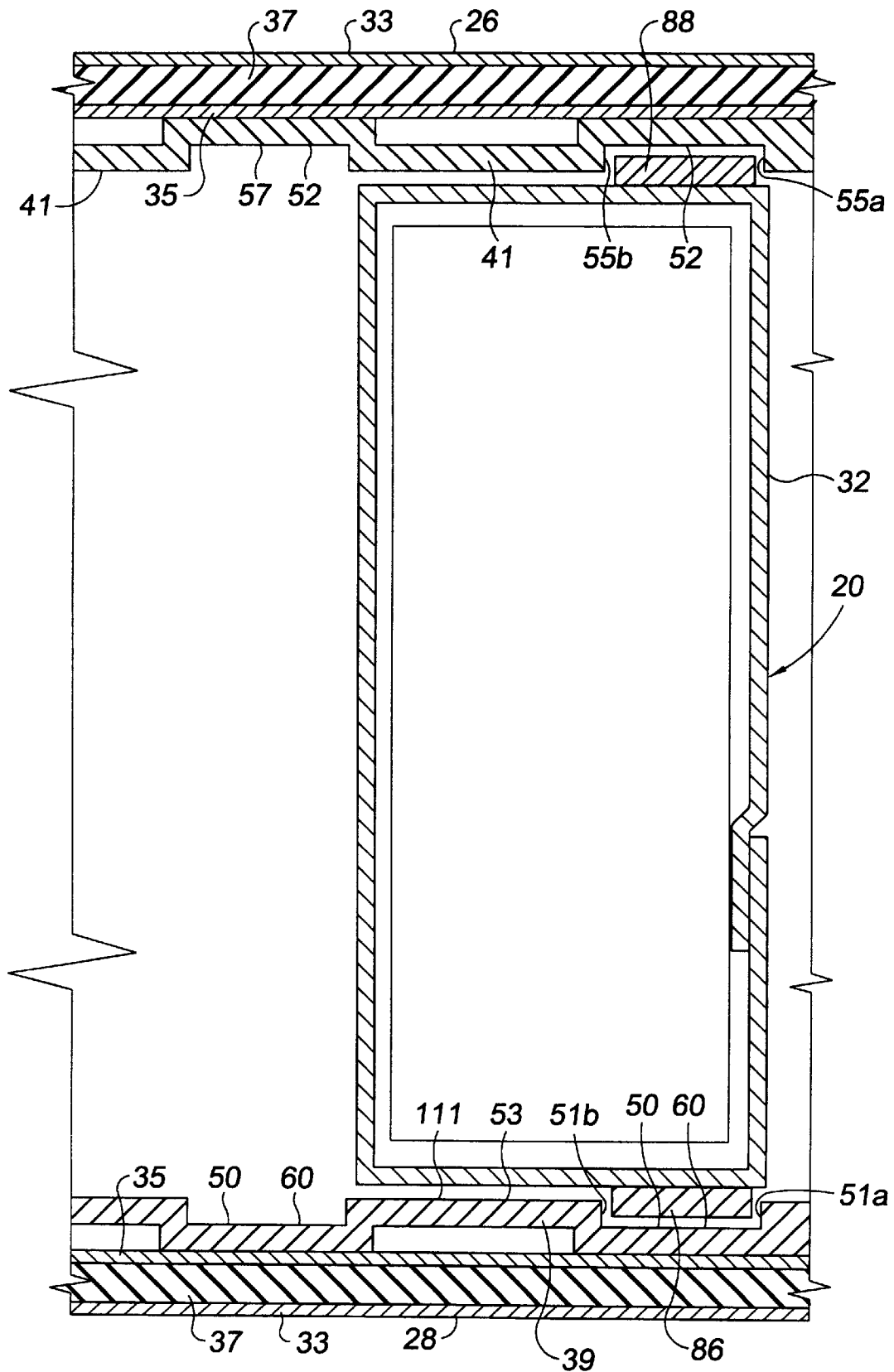
FIG. 5 is an enlarged representative partial section taken along the line 5—5 of FIG. 2.
Figure 8:
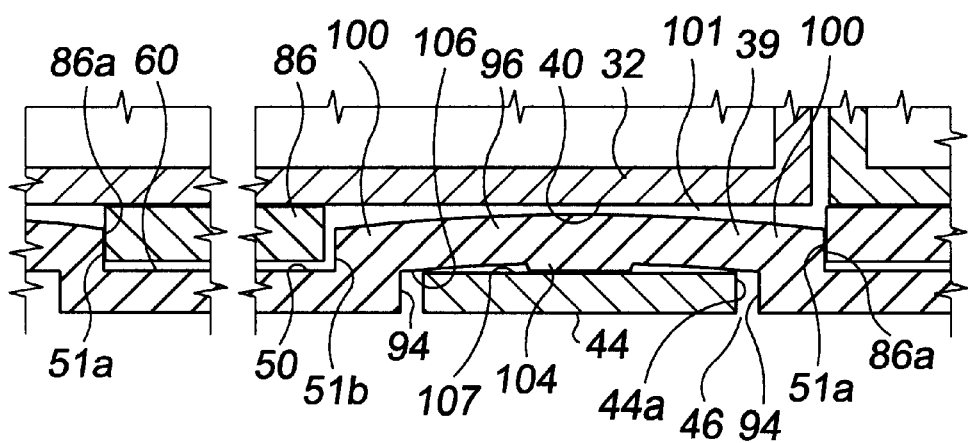
FIG. 8 is an enlarged section taken along line 8—8 of FIG. 6.

Upon insertion of the drive housing 32 into the shelf 24, the top guide rail 88 is positioned in the upper guide groove 52 and slides therealong from the front to the mid-panel 30. The upper guide groove 52 restrains the guide rail 88, and thus the housing 32, from becoming laterally misaligned for connection with the power and communications connector 34. The guide rails 86, 88 do not contact the bottom of the guide grooves 50, 52. Preferably, the outer edges 88a, 86a of the upper 88 and lower 86 guide rails engage the outer edges 55a and 51a of the upper 52 and lower 50 guide grooves, as shown in FIGS. 5 and 8, to properly align the housing 32 upon insertion into the shelf 24. The upper 52 and lower 50 guide grooves and upper 88 and lower 86 guide rails work in conjunction with one another to guide the housing 32 to the connector 34.

Referring to FIGS. 9 and 10, the bottom guide rail 86 engages the protrusion 70 of the bottom flexible tongue 64 as the bottom guide rail 86 nears the rear edge of the lower guide panel 39 adjacent the mid-panel 30. On the upper guide rail 88, the spring portion 92 is positioned so as to engage the protrusion of the top flexible tongue 74. The engagement of the bottom guide rail 86 and the protrusion of the bottom flexible tongue 64, in combination with the top guide rail 88 engaging the top flexible tongue 74, centers the drive housing 32 vertically between the top and bottom guide panels for proper engagement with the power and communications connector 34.

Figure 7:
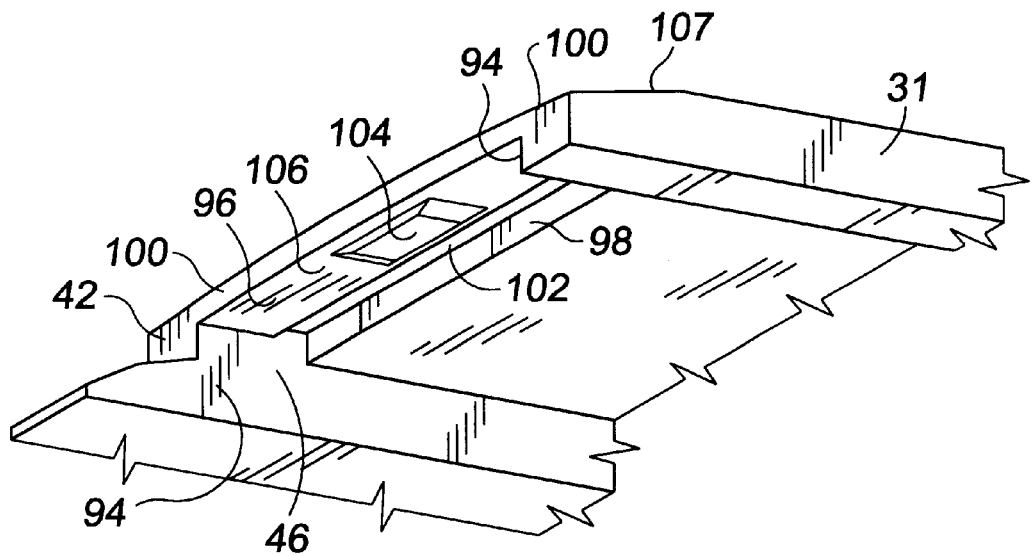
FIG. 7 is an enlarged partial bottom perspective view of the front edge of a bottom guide panel of a shelf.

Referring to FIGS. 7 and 8, the slot 46 of the vibration reducing structure 36 is formed on the front edge 42 of the lower guide panel 39, adjacent to the groove guide 50. The slot 46 is defined by opposing sidewalls 94, a top wall 96, and a rear wall 98. The slot 46 is approximately 0.9 inches wide.

The top wall or beam 96 is a fixed beam and is attached only at its opposing ends 100 at the intersection of the top wall 96 and the opposing sidewalls 94. The top wall 96 is not connected along its length to the rear wall 98. A slit 102 is formed between the long edge of the top wall 96 where it extends adjacent the top edge of the rear wall 98 to separate the top wall 96 from the rear wall 98. The top wall 96 defines a bearing surface 104 centrally positioned on its undersurface 106. The bearing surface 104 extends approximately 0.005 inches from the undersurface 106 of the beam 96. The top wall 96 has an upper surface 107 that slopes upwardly away from the front edge of the lower guide panel 39.

Figure 6:
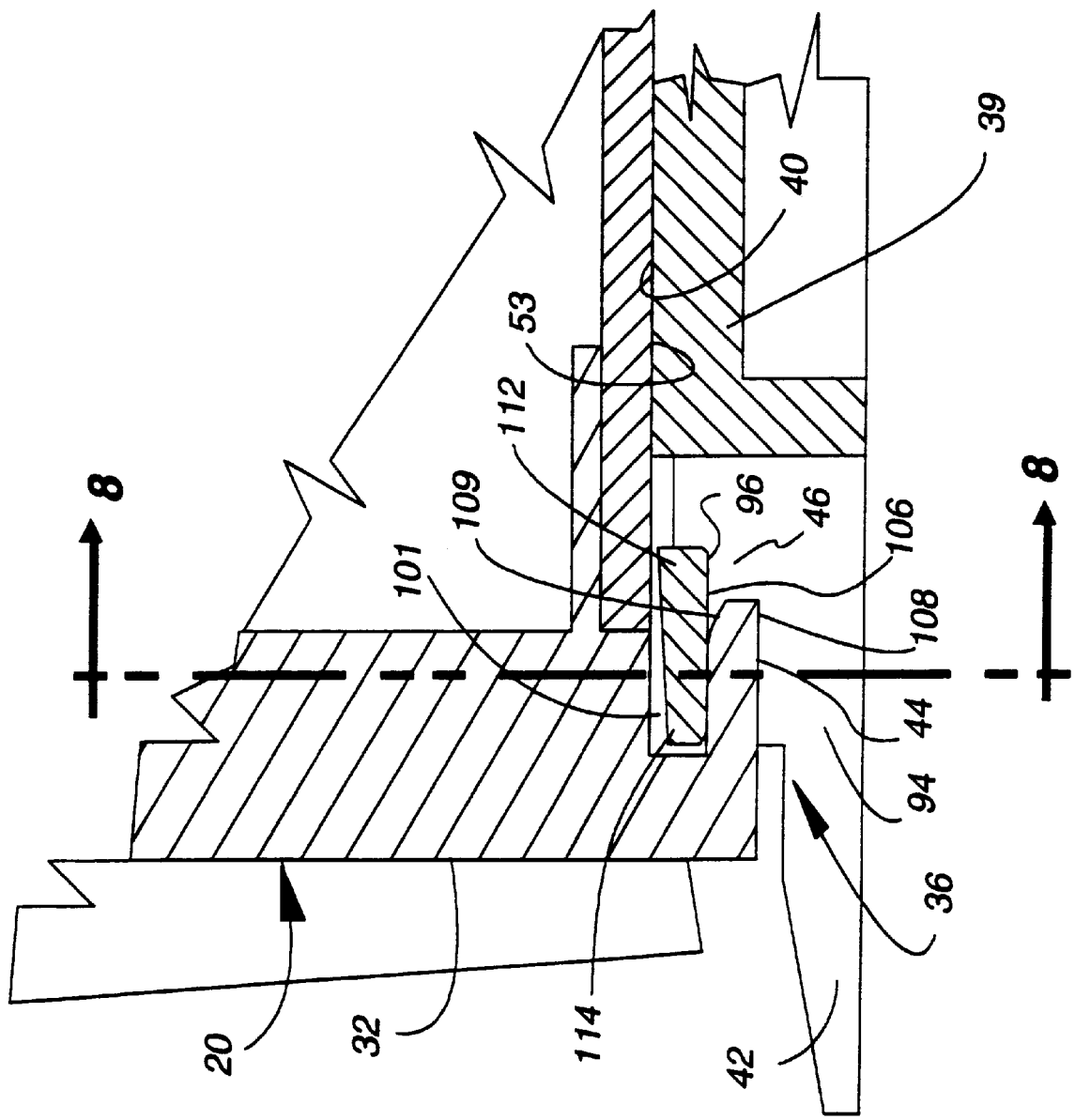
FIG. 6 is an enlarged partial section taken along line 6—6 of FIG. 3.

The top wall 96 is offset below the upper surface 53 of the lower guide panel 39, as shown in FIG. 6. This offset results in a gap 101 formed between the bottom wall 40 of the housing 32 when the bottom wall 40 engages the upper surface 53 of the lower guide panel 39 during insertion, and when inserted. The importance of this gap is described below in greater detail.

Referring to FIGS. 4, 6 and 8, the tab 44 of the vibration reducing structure 36 is attached to the housing 32 at the intersection of the front 82 and bottom 40 sides, and extends from the front edge of the bottom surface 40 of the housing 32 towards the rear edge of the bottom surface of the housing. Preferably, the tab 44 is spaced away from the bottom surface 40 of the housing 32 by approximately 0.080 inches. The tab 44 has a sloped upwardly facing engagement surface 109, being thinner at the free end 108 and thicker at the end attached to the housing. The sloped surface 109, for example, could be a rounded front corner to act as a cam surface to allow the tab 44 to easily slip past the front edge of the top wall 96 of the slot 46. The tab 44 is dimensioned so that when the outer edge 86a of the lower guide rail 86 is engaged against the outer edge 51a of the lower guide groove 50, there is preferably only about 0.005 inches total clearance laterally between the outer edge 44a of the tab 44 and the adjacent outer wall 94 of the slot 46.

The top wall 96 of the slot 46 is positioned to create an interference fit with the tab 44. The tab 44 is designed to have sufficient rigidity to not appreciably deflect when engaged in the slot 46, as described below.

The action of the tab and slot structure 36 of the present invention, in general, is as follows: 1) the insertion of the tab 44 into the slot 46 engages the bearing surface 104 on the top wall 96 to deflect the top wall 96 upwardly, reducing the size of the gap 101 and 2) the deflection of the top wall 96 upwardly biases the tab 44 downwardly to secure the drive housing 32 to the bottom guide panel.

In operation, upon insertion of the housing 32 into the shelf 24, the upper 88 and lower 86 guide rails are positioned in and slide along the respective upper 52 and lower 50 guide grooves. The bottom 40 of the housing 32 engages the upper surface 53 of the lower guide panel 39, and the guide rails do not engage the bottoms of the guide grooves. As the electrical connector 34 is engaged by the connector 85 on the rear wall 84 of the housing 32, the tab 44 is inserted into the slot 46. The engagement of the bottom 40 of the housing 32 against the upper surface of the lower guide panel determines the relative position of the tab 44 with the slot 46, since the slot 46 is formed in the bottom guide panel and the tab 44 is formed on the housing 32. The relative positioning of the tab 44 to the slot 46 is designed such that the tab 44 does not simply slide into the slot 46, but rather engages the top wall 96 of the slot 46 during insertion.

The sloped engagement surface 109 of the tab 44 allows the free end 108 of the tab to be inserted into the slot 46. As the tab 44 is inserted further, the sloped engagement surface 109 of the tab engages the bearing surface 104 on the top wall 96 of the recess to deflect the top wall 96 upwardly (See FIG. 8). The upward deflection of the fixed beam reduces the size of the gap 101 as the fixed beam moves toward the bottom 40 of the housing 32. Upon full insertion of the housing into the shelf 24, the housing 32 is clamped to the upper surface 53 of the lower guide panel 39, at least adjacent the slot, if not along the entire length of the bottom 40 of the housing 32. The bottom 40 may not be in continuous engagement with the top surface 53 of the lower guide panel 39 due to manufacturing tolerances, resulting in a gap 111 potentially being formed therebetween (See FIG. 5). The housing 32 is thus fixed to the shelf in at least two places: the engagement of the electrical connectors 34 and 85 and the tab and slot attachment mechanism 36.

Referring to FIG. 8, by engaging the bearing surface 104 on the top wall 96, the tab 44 causes the top wall 96 to deflect upwardly, substantially at the center point along its length, so the stresses associated with the deflection of the fixed beam 96 are evenly distributed along the length of the beam 96 to reduce the potential damage due to uneven stresses. The theoretical limit to the upward deflection of the fixed beam 96 is the point where the shear stress at the intersection of the opposing ends 100 of the fixed beam 96 and the opposing sidewalls of the slot becomes so great that the fixed beam fails at one or both of those intersections.

The fixed beam 96 preferably has elastic qualities. When it is deflected upwardly the beam 96 generates a downwardly directed bias force and tries to regain its original position. Therefore, the upward deflection of the fixed beam 96 caused by the engagement of the tab 44 creates a downwardly directed bias force on the tab 44, which in turn biases the drive housing 32 against the shelf 28 to hold it securely thereto. The fixed beam 96 develops an adequate reaction force (spring constant) with acceptable stress levels in the material for the given space limitation. This allows the tab and slot structure 36 to be under load (engaged) for continuous periods of time without any appreciable degradation of the bias force of the beam 96 on the tab 44.

While the upward deflection of the fixed beam 96 is the primary force biasing the bottom 40 of the housing 32 against the upper surface 53 of the lower guide panel 39, the fixed beam 96 is also under a moment load, which also acts to generate a force biasing the housing 32 against the lower guide panel 39. As shown in FIG. 6, when in full engagement, only the front portion 109 of the beam 96 is in engagement with the tab 44. The rear portion 112 of the beam 96 is not engaged by the tab 44. The force of the tab 44 on the front portion 114 of the beam 96 creates a moment, or rotational, force about an axis running the length of the beam. In other words, it attempts to twist the beam in a clockwise direction as shown in FIG. 6. This moment force creates an opposite and responsive bias force in the beam 96 attempting to regain its original position, which in turn adds to the bias force resulting from the deflection, all working to clamp or engage the housing to the lower guide panel 39.

This interference fit secures the housing 32 to the shelf 24, and imparts the desired "tight fit" of the housing 32 to the shelf 24, as described above.

The combination of the guide structure 38 and the tab and slot structure 36 securely positions the housing 32 in the proper lateral and vertical position.

The tab 44 is removed from the slot 46 when the housing 32 is removed from the shelf. The interference fit of the tab 44 and slot 46 is overcome by the extraction force applied to the housing 32 to remove it from the shelf 24. When removed, the top wall 96 returns to its original position.

The upper 52 and lower 50 guide grooves guide the housing 32 into and out of the slot 46 quickly and accurately to allow repeatable connection and disconnection of the housing 32 to the power and communication connector 34 on the mid-panel 30 of the shelf 24. The tab 44 is able to be repeatably inserted into and extracted from the slot 46 to effectively clamp and release, respectively, the front end of the housing 32 to the shelf 24.

Each of the housings 32 on the shelf 24 are attached to the bottom panel 39 of the shelf 24 using the tab 44 and slot 46 vibration reduction structure 36, which reduces the likelihood of vibrations being generated at the interface of each housing 32 to the bottom panel 39 because the housings are rigidly secured thereto by the present invention.

Although the present invention has been described with a certain degree of particularity, it is understood that the present disclosure has been made by way of example, and changes in detail or structure may be made without departing from the spirit of the invention, as defined in the appended claims.

We claim:

1. A disk drive system comprising:

a disk drive having a housing, said housing having a bottom surface and a front surface;

a shelf for receiving said disk drive housing;

a slot formed in said shelf;

a recess formed adjacent to a front edge of said shelf, said recess including a flexible top wall;

a tab extending from said bottom of said housing, said tab spaced away from said bottom surface of said housing and extending rearwardly from said front surface, said tab engaging said top wall of said recess when said disk drive housing is positioned on said shelf with said tab positioned in said slot, to attach said housing to said shelf; and said disk drive housing positioned on said shelf with said tab positioned in said slot, with said top wall deflecting upwardly upon engagement with said tab, to attach said housing to said shelf.

2. A system as defined in claim 1, wherein:

said tab extends rearwardly from said front surface; and said slot is formed adjacent to a front edge of said shelf.

3. A system as defined in claim 1, wherein:

said top wall is a fixed beam having opposing ends, and is attached to said shelf at said opposing ends.

4. A system as defined in claim 3, wherein:

said fixed beam having an undersurface; and further comprising a bearing surface formed on said undersurface and extending outwardly therefrom for engagement with said tab.

5. A system as defined in claim 1, wherein:

said shelf is elongated and defines a guide slot extending transversely to its length, said guide slot formed adjacent to said slot;

said housing defines a guide rail on said bottom surface; and said guide slot receives said guide rail to laterally position said housing when said disk drive housing is positioned on said shelf with said tab positioned in said slot to attach said housing to said shelf.

* * * * *